United States Patent
Ruemmer et al.

(10) Patent No.: US 6,285,864 B1
(45) Date of Patent: *Sep. 4, 2001

(54) METHOD FOR ADJUSTMENT OF A TRANSMITTER CARRIER FREQUENCY IN A SUBSCRIBER STATION OF A POINT-TO-MULTIPOINT RADIO TRANSMISSION SYSTEM

(75) Inventors: Wolfgang Ruemmer, Backnang; Andreas Bollmann, Esingen, both of (DE)

(73) Assignee: Robert Bosch GmbH, Stuttgart (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,123

(22) Filed: Jul. 20, 1998

(30) Foreign Application Priority Data

Aug. 29, 1997 (DE) ................................. 197 37 758

(51) Int. Cl.[7] .............................. H04B 1/06; H04B 15/00
(52) U.S. Cl. ............................ 455/265; 455/71; 455/502
(58) Field of Search .................................. 455/436, 437, 455/502, 265, 454, 91, 92, 71

(56) References Cited

U.S. PATENT DOCUMENTS

| | | | | |
|---|---|---|---|---|
| 5,081,705 | * | 1/1992 | Swanke .................. | 455/260 |
| 5,216,717 | * | 6/1993 | Bourcet et al. ............ | 381/3 |
| 5,249,305 | * | 9/1993 | Wieczorek et al. .......... | 455/517 |
| 5,450,617 | * | 9/1995 | Moore .................... | 455/522 |
| 5,794,119 | * | 8/1998 | Evans et al. .............. | 455/6.2 |
| 5,801,783 | * | 9/1998 | Ross ..................... | 455/502 |
| 5,805,984 | * | 9/1998 | Tangen ................... | 455/71 |
| 5,812,614 | * | 9/1998 | Baum et al. .............. | 375/344 |
| 5,826,197 | * | 10/1998 | Nagat et al. ............. | 455/524 |
| 5,983,101 | * | 11/1999 | Billstrom ................ | 455/426 |

FOREIGN PATENT DOCUMENTS 196 35 533 A1  10/1997  (DE).

\* cited by examiner

*Primary Examiner*—Vivian Chang
*Assistant Examiner*—Charles N. Appiah
(74) *Attorney, Agent, or Firm*—Michael J. Striker

(57) ABSTRACT

The method includes deriving all receiver carrier frequencies and all transmitter carrier frequencies of the base station from a common reference frequency; comparing a transmitter carrier frequency of a subscriber station with a receiver carrier frequency in the base station to obtain an average frequency deviation; transmitting the average frequency deviation to the concerned subscriber station; adjusting the transmitter carrier frequency of the subscriber station so that the frequency deviation is minimized; when data is to be transmitted with other carrier frequencies, switching from the receiver channel and transmitter channel to other channels; and prior to switching deriving new transmitter and receiver carrier frequencies (TMTx2, TMRx2) of the subscriber station according to the following formulae:

$$TMTx2=\{1/C\}[BSRx2+ZFLOBS(m'-n\cdot C)+RFLOBS(1-R)],$$

$$TMRx2=\{1/C\}[BSTx2+ZFLOBS(m-n'\cdot C)+RFLOBS(1-R)],$$

wherein BSRx2 and BSTx2 are new receiver and transmitter carrier frequencies in the base station, RFLOBS and ZFLOBS are reference frequencies for respective frequency converters in the base station, C is ZFLOTM/ZFLOBS, ZFLOTM and ZFLOBS are respective reference frequencies for corresponding frequency converters in the subscriber station, R equals RFLOTM/RFLOBS, m and n are multiplying factors for the converters in the base station and m' and n' are multiplying factors for the converters in the subscriber station.

1 Claim, 2 Drawing Sheets

METHOD FOR ADJUSTMENT OF A TRANSMITTER CARRIER FREQUENCY IN A SUBSCRIBER STATION OF A POINT-TO-MULTIPOINT RADIO TRANSMISSION SYSTEM

BACKGROUND OF THE INVENTION

The present invention concerns a method for adjusting or setting a transmitter carrier frequency in a subscriber station of a point-to-multipoint radio transmission system, in which a base station is provided with as many modems as the maximum number of subscriber stations that can be connected with it and similarly each subscriber station has a modem.

This sort of point-to-multipoint radio transmission system is described in the unpublished German Patent Application 196 355 33.8. In this radio transmission system communication between the base station and the individual subscriber stations occurs by frequency division multiple access (FDMA). Thus the flexible transmission capacity is designed for the needs and number of the subscribers, since the bandwidth of the individual transmitter channels is adjusted to the data transmission rate required by the respective individual subscribers stations. Flexible assignment and adjustment of the transmission capacity is possible in the connected subscriber stations without interference and interruption. Also every modem in the base station and in the individual subscriber stations has at least two transmitter and at least two receiver channels, and the signal transmission between the base station and one of the subscriber stations occurs first only over one transmitter and receiver channel. When the transmitter channel is changed, a control device sets the new transmission parameters (channel carrier frequencies, data rate, modulation, coding and transmitter signal level) in the at least one transmitter or receiver channel not found in operation, while the signal transmission in the other transmitter or receiver channel is continued. After finishing acquisition of the channel with the new transmission parameters switching to the transmitter or receiver channel not previously in operation occurs.

SUMMARY OF THE INVENTION

It is an object of the present invention to provide a process of the above-described kind for synchronization of the transmitter and receiver carrier frequencies of the base station and the subscriber stations with minimal hardware expense.

This object, and others which will be made more apparent hereinafter, is attained in a method for adjusting or setting a transmitter carrier frequency in a subscriber station of a point-to-multipoint radio transmission system, in which a base station is equipped with as many modems as the maximum number of subscriber stations that can be connected with it by radio transmissions and similarly each subscriber station has a modem.

According to the invention, all receiver carrier frequencies and all transmitter carrier frequencies of the base station are derived from a common reference frequency; a transmitter carrier frequency of a transmitter carrier propagated from a respective subscriber station is compared with the corresponding receiver carrier frequency in the base station; an average frequency deviation between the transmitter carrier frequency of the subscriber station and the receiver carrier frequency of the base station is transmitted to the subscriber station and the transmitter carrier frequency of the subscriber station is adjusted so that the frequency deviation is minimized.

In preferred embodiments also the receiver carrier frequency of the subscriber station is changed according to the frequency deviation so that the frequency deviation is minimized.

Because all transmitter and receiver carrier frequencies are derived from a single reference in the base station, the relative positions of all carrier frequencies with respect to each other are comparatively very stable. The position of the carrier frequencies of the individual subscriber stations adjusts itself to the relative position of the carrier frequency in the base station. One can thus use free-running local oscillators in the base station and in the subscriber stations, which do not need to be synchronized with each other with expensive circuitry.

In other embodiments each modem in the base station and in the subscriber stations has two transmitter channels and two receiver channels. Switching from one transmitter/receiver channel to the other transmitter/receiver channel occurs, when data should be transmitted with another pair of transmitter and receiver frequencies. Prior to the switching of the transmitter and receiver channels the new transmitter and receiver carrier frequencies for the concerned subscriber station are derived from the frequency deviation between the previous transmitter carrier frequency of the subscriber and the previous receiver carrier frequency of the base station and from the new transmitter carrier frequency and the new receiver carrier frequency of the base station.

BRIEF DESCRIPTION OF THE DRAWING

The objects, features and advantages of the invention will now be illustrated in more detail with the aid of the following description of the preferred embodiments, with reference to the accompanying figures in which.

DETAILED DESCRIPTION OF THE PREFERRED EMBODIMENTS

Figures 1, 2:
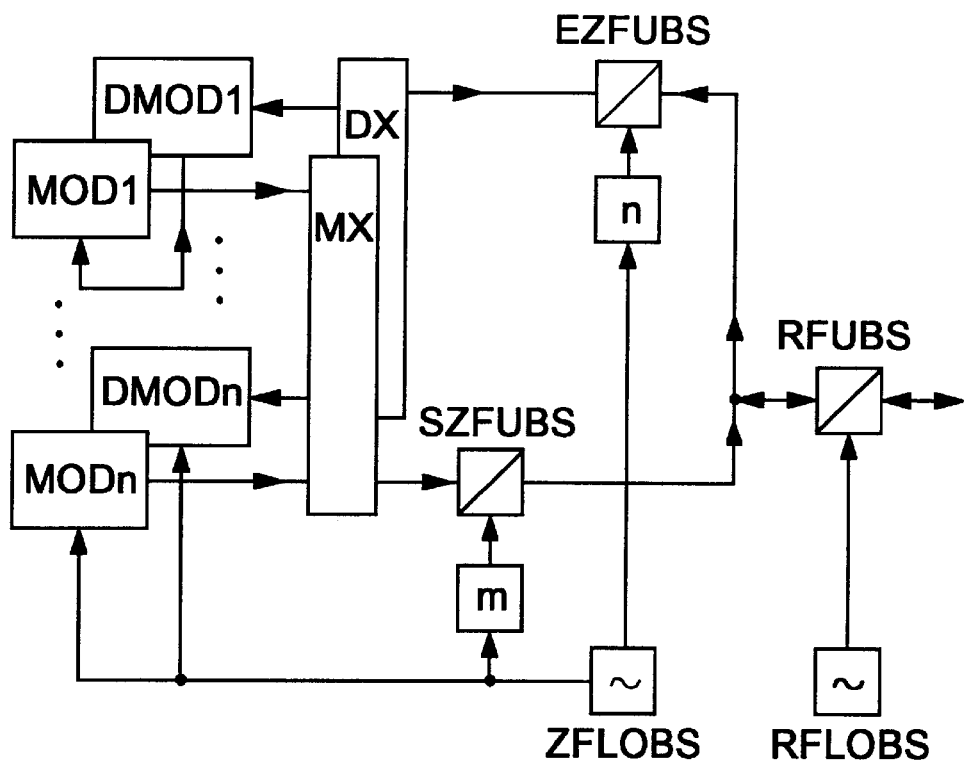
FIG. 1 is a block diagram of a base station.
FIG. 2 is a block diagram of a subscriber station.

A point-to-multipoint radio transmission system comprises a base station, whose principal block diagram is shown in FIG. 1, and several subscriber stations, each of which is constructed according to the block diagram shown in FIG. 2.

The base station shown in FIG. 1 has n modems. The number n corresponds to the maximum possible number of subscriber stations that can be connected with the base station by radio transmissions in the system. Each modem comprises a modulator MOD1, . . . , MODn and a demodulator DMOD1, . . . DMODn. Similarly each subscriber station (see FIG. 2) has a modem comprising a demodulator DMOD1' and a modulator MOD1'.

In the outbound direction—that is the transmission direction from the base station to the subscriber station—the signals produced by modulator MOD1 of the base station are transmitted to the subscriber station and received by the demodulator DMOD1' there. In the opposite direction—the inbound direction—the signals produced by modulator MOD1' in the subscriber station are transmitted to the base station and received there by the demodulator DMOD1. So that reception of signals transmitted in both directions is possible, the receiver carrier of the demodulator DMOD1' of the subscriber station must be tuned to the transmitter carrier of the modulator MOD1 of the base station. Similarly the transmitter carrier of the modulator MOD1' of the subscriber must be tuned to the receiver carrier of the demodulator DMOD1 of the base station.

The receiver carrier frequency and the transmitter carrier frequency in all modulators MOD1, . . . , MODn and the demodulators DMOD1, . . . , DMODn in the base station are derived from a free-running local oscillator ZFLOBS. All modulators MOD1, . . . , MODn are connected by a multiplexer MX to a transmitter intermediate frequency converter SZFUBS and all demodulators DMOD1, . . . , DMODn are connected to a receiver intermediate frequency converter EZFUBS. The intermediate frequency converters SZFUBS and EZFUBS obtain their reference frequencies similarly from the local oscillator ZFLOBS, whereby different frequency multiplying factors m, for the transmitter converter, and n, for the receiver converter, are provided. A high frequency converter RFUBS that obtains its reference frequency from its own local oscillator RFLOBS follows them. As already stated, both local oscillators ZFLOBS and RFLOBS run free, and no measures are taken to stabilize their oscillator frequencies. The frequency band available for the signal transmission in the outbound direction experiences an expansion or compression effect (multiplicative effect) and an offset (additive effective) when the frequencies of both local oscillators ZFLOBS and RFLOBS drift. Because all modulators MOD1, . . . , MODn and all demodulators DMOD1, . . . , DMODn derive their transmitter and receiver carrier frequencies from a common local oscillator ZFLOBS, all transmitter carriers and all receiver carriers remain in a fixed pattern, which means that the ratio or relationship of the carrier spacing remains constant.

Each individual subscriber station has two free-running local oscillators RFLOTM and ZFLOTM. The first local oscillator RFLOTM supplies a reference frequency for a high frequency converter RFUTM and the second local oscillator ZFLOTM supplies the reference frequencies for a transmitter-intermediate frequency converter SZFUTM and for a receiver-intermediate frequency converter EXFUTM. Different multiplying factors m' and n' for the reference frequency of the local oscillator ZFLOTM are provided for the transmitter converter SZFUTM and the receiver converter EXFUTM. Furthermore the modulator MOD1' and the demodulator DMOD1' derive their transmitter carrier frequency and their receiver carrier frequency from the reference frequency of the local oscillator ZFLOTM. Since the free-running local oscillators RFLOTM and ZFLOTM of all subscriber stations are not synchronized with each other an expansion or compression and an offset of the inbound frequency band occurs. Also the individual carriers of the incoming frequency bands drift relative to each other so that the carriers are no longer equidistant from each other.

Because of the relative opposing drifts of the carriers of the inbound frequency bands, there is a danger of cross-talk between the frequency channels of the individual carriers so that a sufficiently large spacing (guard bands) must be provided between the individual frequency channels. The guard bands however should be kept as small as possible to provide optimum frequency economies. That is also true, when one tries to maintain the carriers equally spaced from each other. The following paragraphs describe measures required to obtain this goal.

The transmitter carrier transmitted from the subscriber station to the base station is compared in the associated demodulator DMOD1 or a separate circuit with the set frequency of the receiver carrier of this demodulator DMOD1. If a frequency shift between the transmitter carrier of the subscriber station and the receiver carrier of the base station is detected, the base station transmits the frequency shift back or feeds it back to the subscriber station, and the transmitter carrier frequency of modulator MOD1' is adjusted so that the frequency shift is minimized. The frequency shift value transmitted from the base station can be transmitted in a broadcast channel or in an overhead band of a useful signal channel to the subscriber station. This procedure between the base station and each subscriber station is performed for each subscriber station. An equidistant pattern of transmitter carriers in the inbound frequency band is obtained which arranges itself in the carrier frequency pattern of the outbound frequency band.

The transmitter carrier of the subscriber stations not only can be corrected according to the frequency deviation values, but also the receiver carrier of the demodulator DMOD1' in the subscriber station.

Figure 3:
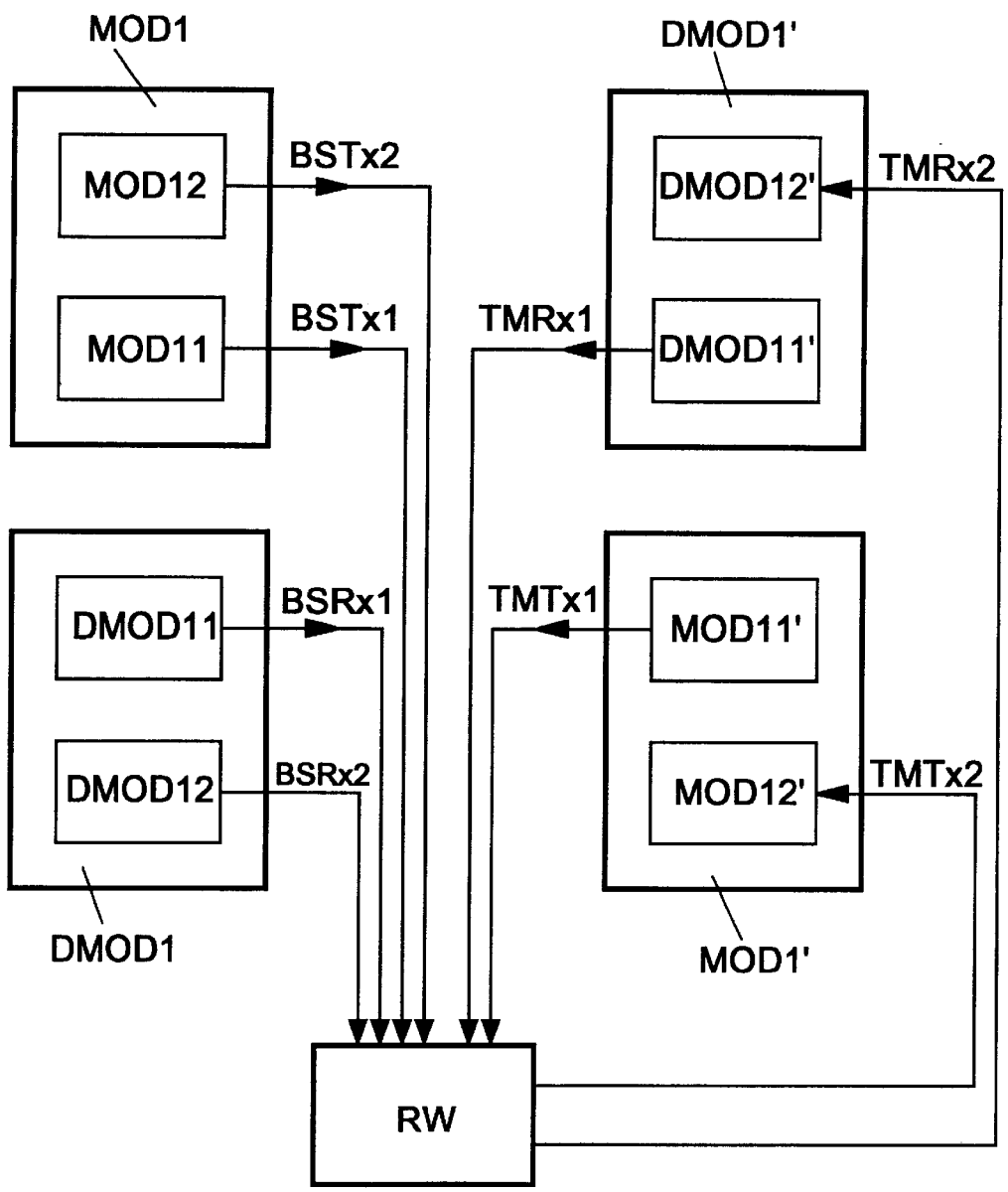
FIG. 3 is an operational scheme for deriving a carrier frequency for a subscriber station.

It has already been stated that it is very appropriate to provide at least two receiver channels and at least two transmitter channels in each modem in the base station and in the subscriber stations in order to be able to switch without interruption from one frequency channel to another in the base station and also in the subscriber stations. In FIG. 3 in the base station the modulator MOD1 has two transmitter channels MOD11, MOD12 and the demodulator DMOD1 has two receiver channels DMOD11, DMOD12. Similarly in the subscriber station the modulator MOD1' comprises two modulators MOD11', MOD12' and the demodulator DMOD1' comprises two demodulators DMOD11', DMOD12'. Instead of only two transmitter and receiver channels provided in the base station and the subscriber station, several transmitter and receiver channels can be provided for each.

The modulator MOD11 in the base station transmits on the carrier frequency BSTx1 and the demodulator DMOD11 receives on the carrier frequency BSRx1. Now switching in the transmission direction to a new frequency channel with the new carrier frequency BSTx2 and in the reception direction to a new frequency channel with the new carrier frequency BSRx2 should occur. The demodulator DMOD11' in the subscriber station is currently tuned to the receiver carrier frequency TMRx1, in order to receive signals of the modem MOD11 of the base station with the transmitter carrier frequency BSTx1. In the opposite direction the modulator MOD11' of the subscriber station transmits with the transmitter carrier frequency TMTx1 which is received by the demodulator DMOD11 of the base station with the receiver carrier frequency BSRx1. After switching to a new frequency channel the demodulator DMOD12' of the subscriber station should receive with the receiver carrier frequency TMTx2 the signals propagated by the modulator MOD12 with the carrier frequency BSTx2. Thus the new receiver carrier frequency TMRx2 and the new transmitter carrier frequency TMTx2 of the subscriber station are adjusted so that they have the smallest possible deviation from the new transmitter carrier frequency BSTx2 and the new receiver carrier frequency BSRx2 respectively. A processor RW is provided in the base station to determine the new receiver carrier frequency TMRx2 and the new transmitter carrier frequency TMTx2 of the subscriber station. The function of the processor RW can however be performed in part by circuitry in the base station and circuitry in the subscriber stations.

As shown in FIG. 3 the current transmitter carrier frequency BSTx1, the current receiver carrier frequency BSRx1, the new transmitter carrier frequency BSTx2 and the new receiver carrier frequency BSRx2 are input to the processor RW of the base station. Furthermore the processor RW receives the current receiver carrier frequency TMRx1 and the current transmitter carrier frequency TMTx1 of the subscriber station. From the frequency deviation between the current carriers of the base station and the current carriers of the subscriber station and the new carriers of the base station, the new carriers for the subscriber station are computed in the processor RW.

For the adjusted transmitter carrier frequency TMTx1:

$$TMTx1=\{1/C\}[BSRx1+n \cdot ZFLOBS+RFLOBS-RFLOTM-m' \cdot ZFLOTM] \quad (1)$$

wherein C=ZFLOTM/ZFLOBS, the drift between the reference frequencies of the local oscillators ZFLOTM and ZFLOBS.

Similarly the ratio of the reference frequencies of the local oscillators RFLOBS and RFLOTM of the base station and the subscriber station is:

$$R=RFLOTM/RFLOBS \quad (2)$$

Thus it follows from equation (2) that:

$$TMTx1=\{1/C\}[BSRx1+ZFLOBS(m'-n \cdot C)+RFLOBS(1-R)] \quad (3)$$

For the adjusted receiver carrier frequency TMRx1 similarly:

$$TMRx1=\{1/C\}[BSTx1+m \cdot ZFLOBS+RFLOBS-RFLOTM-n' \cdot ZFLOTM]. \quad (4)$$

From the above-defined ratio R it follows that:

$$TMRx1=\{1/C\}[BSTx1+ZFLOBS(m-n' \cdot C)+RFLOBS(1-R)] \quad (5)$$

Since the nominal values of the carrier frequencies BSTx1, BXRx1, TMTx1 and TMRx1 are known, as also are the multiplying factors m, n, m' and n', as well as the nominal local oscillator frequencies RFLOBS and ZFLOBS of the base station, the factors C and R in the above set forth equations (1) to (5) can be determined in the processor RW according to:

$$C,R=f(BSTx1, BSRx1, TMTx1, TMRx1, m, n, m',n', RFLOBS, ZFLOBS) \quad (6).$$

In the same way the desired new transmitter and receiver carrier frequencies TMTx2 and TMRx2 are calculated from the predetermined carrier frequencies BSTx2 and BXRx2 of the base station:

$$TMTx2=\{1/C\}[BSRx2+ZFLOBS(m'-n \cdot C)+RFLOBS(1-R)] \quad (7)$$

$$TMRx2=\{1/C\}[BSTx2+ZFLOBS(m-n' \cdot C)+RFLOBS(1-R)] \quad (8).$$

The local oscillator frequencies ZFLOBS and RFLOBs are known and remain constant, like the multiplying factors m, n, m' and n'. The ratios C and R are calculated before the carrier frequencies TMTx1 and TMRx1. Thus the equations for the carrier frequencies TMTx2 and TMRx2 are solvable.

Both transmitter and receiver channels in the base station and the subscriber station are shown symbolically in FIG. 3 as two modulator blocks and two demodulator blocks. Each transmitter channel and each receiver channel can of course be formed separately in the hardware. It is however also possible to provide a transmitter signal path and a receiver signal path that is switchable from the current frequency channel to a new frequency channel in multiplex operation.

The disclosure of German Patent Application 197 37 758.0 of Aug. 29, 1997 is hereby explicitly incorporated by reference. This German Patent Application discloses the same invention as described herein and claimed in the claims appended hereinbelow and is the basis for a claim of priority for the instant invention under 35 U.S.C. 119.

While the invention has been illustrated and described as embodied in a method for determining, adjusting or setting a transmitter carrier frequency in a subscriber station of a point-to-multipoint radio transmission system, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

We claim:

1. A method for setting a transmitter carrier frequency in a subscriber station of a point-to-multipoint radio transmission system, said transmission system comprising said subscriber station, a base station and additional subscriber stations, said base station including a number of base station modems equal to a maximum number of said subscriber stations connectable with said base station and each of said subscriber stations also has a subscriber station modem, said method comprising the steps of:

a) deriving all receiver carrier frequencies of all receiver carriers and all transmitter carrier frequencies of all transmitter carriers of the base station from a common reference frequency;

b) comparing a transmitter carrier frequency of a transmitter carrier propagated from said subscriber station with a corresponding one of the receiver carrier frequencies of the base station;

c) transmitting an average frequency deviation between said transmitter carrier frequency of said subscriber station and said one of said receiver carrier frequencies of said base station obtained in the comparing of step b) to said subscriber station;

d) adjusting said transmitter carrier frequency of said subscriber station so that said frequency deviation is minimized;

e) providing each of said modems (MOD1, DMOD1) of the base station and each of said modems (MOD1', DMOD1') of the subscriber station with at least two receiver channels and at least two transmitter channels;

f) when data should be transmitted with another pair of said transmitter and receiver carrier frequencies (BSTx1, BSRx1, TMRx1, TMTx1), switching from one of said at least two receiver channels to another and from one of said at least two transmitter channels to another; and g) prior to said switching of step f), deriving new transmitter and receiver carrier frequencies (TMTx2, TMRx2) for said subscriber station from said frequency deviation between said transmitter carrier frequency (TMTx1) of the subscriber station and said receiver carrier frequency (BSRx1) of the base station, from a new transmitter carrier frequency (BSTx2) and from a new receiver carrier frequency (BSRx2) of the base station, wherein said new transmitter and receiver carrier frequencies for said subscriber station are calculated by the following formulae:

$$TMTx2 = \{1/C\}[BSRx2 + ZFLOBS(m'-n \cdot C) + RFLOBS(1-R)],$$

$$TMRx2 = \{1/C\}[BSTx2 + ZFLOBS(m-n' \cdot C) + RFLOBS(1-R)],$$

wherein RFLOBS and ZFLOBS are respective reference frequencies for corresponding local oscillators for a high frequency converter and an intermediate frequency converter in the base station, C is equal to ZFLOTM/ZFLOBS, ZFLOTM and ZFLOBS being respective references frequencies for corresponding local oscillators for a high frequency converter and an intermediate frequency converter in the subscriber station, R equals RFLOTM/RFLOBS, m and n are respective multiplying factors for the transmitter converter and receiver converter of the base station and m' and n' are respective multiplying factors for the transmitter converter and receiver converter of the subscriber station.

\* \* \* \* \*